(12) United States Patent
Bhalla et al.

(10) Patent No.: US 9,024,378 B2
(45) Date of Patent: May 5, 2015

(54) DEVICE STRUCTURE AND MANUFACTURING METHOD USING HDP DEPOSITED SOURCE-BODY IMPLANT BLOCK

(71) Applicants: Anup Bhalla, Santa Clara, CA (US); François Hébert, San Mateo, CA (US); Sung-Shan Tai, San Jose, CA (US); Sik K Lui, Sunnyvale, CA (US)

(72) Inventors: Anup Bhalla, Santa Clara, CA (US); François Hébert, San Mateo, CA (US); Sung-Shan Tai, San Jose, CA (US); Sik K Lui, Sunnyvale, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 13/763,644

(22) Filed: Feb. 9, 2013

(65) Prior Publication Data

US 2014/0225187 A1    Aug. 14, 2014

(51) Int. Cl.
*H01L 29/78* (2006.01)
*H01L 21/265* (2006.01)
*H01L 29/66* (2006.01)

(52) U.S. Cl.
CPC .......... *H01L 29/7827* (2013.01); *H01L 21/265* (2013.01); *H01L 29/66666* (2013.01)

(58) Field of Classification Search
CPC ............ H01L 29/7802; H01L 29/7809; H01L 29/7813; H01L 29/1095; H01L 29/7811; H01L 29/7397; H01L 29/4236; H01L 29/66734; H01L 29/0696; H01L 29/66348; H01L 29/7816; H01L 21/046; H01L 21/265; H01L 29/66666; H01L 29/7827
USPC .......... 257/330–332, E21.258; 438/206, 272, 438/478, 531, 498–499
See application file for complete search history.

(56) References Cited

U.S. PATENT DOCUMENTS

| | | | | |
|---|---|---|---|---|
| 5,430,324 | A * | 7/1995 | Bencuya | 257/495 |
| 6,051,468 | A * | 4/2000 | Hshieh | 438/270 |
| 6,168,991 | B1 * | 1/2001 | Choi et al. | 438/254 |
| 6,211,018 | B1 * | 4/2001 | Nam et al. | 438/270 |
| 8,372,708 | B2 * | 2/2013 | Bhalla et al. | 438/206 |
| 2002/0041003 | A1 * | 4/2002 | Udrea et al. | 257/502 |
| 2006/0286765 | A1 * | 12/2006 | Ilnuma | 438/424 |

* cited by examiner

*Primary Examiner* — Howard Weiss
*Assistant Examiner* — Sue Tang
(74) *Attorney, Agent, or Firm* — Bo-In Lin

(57) ABSTRACT

This invention discloses a semiconductor power device. The trenched semiconductor power device includes a trenched gate, opened from a top surface of a semiconductor substrate, surrounded by a source region encompassed in a body region near the top surface above a drain region disposed on a bottom surface of a substrate. The semiconductor power device further includes an implanting-ion block disposed above the top surface on a mesa area next to the body region having a thickness substantially larger than 0.3 micron for blocking body implanting ions and source ions from entering into the substrate under the mesa area whereby masks for manufacturing the semiconductor power device can be reduced.

18 Claims, 10 Drawing Sheets

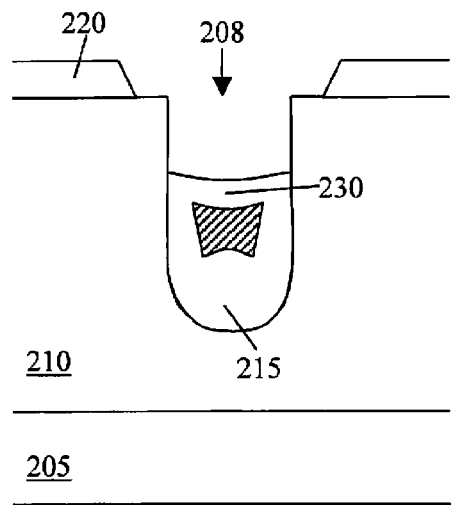
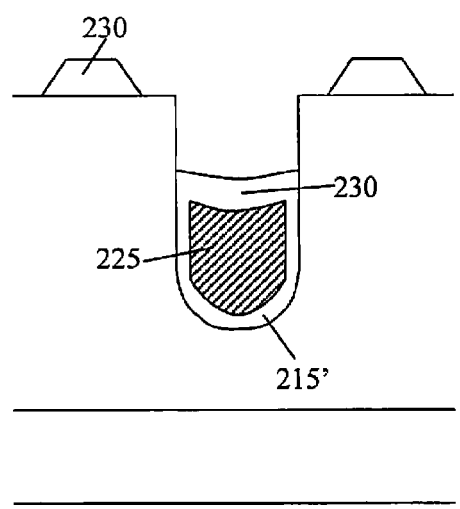
FIG. 4D                FIG. 5D
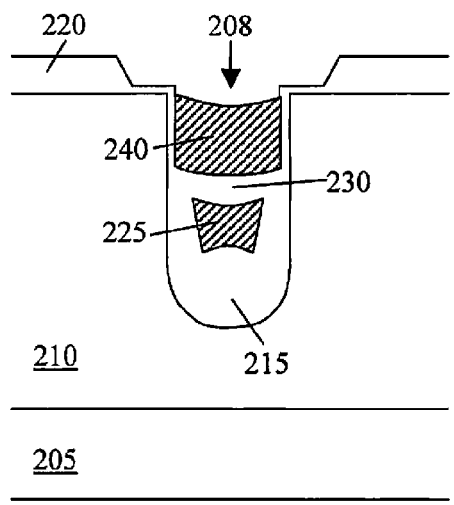
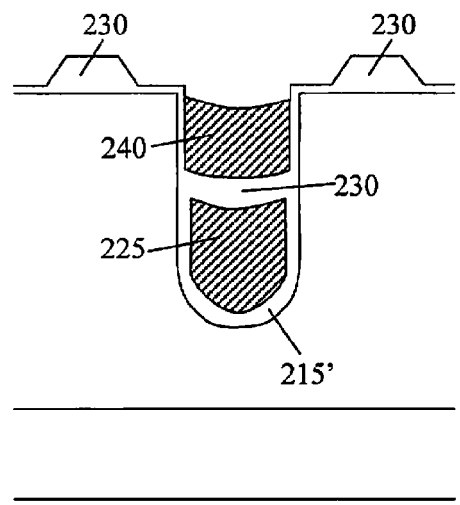
FIG. 4E                FIG. 5E

DEVICE STRUCTURE AND MANUFACTURING METHOD USING HDP DEPOSITED SOURCE-BODY IMPLANT BLOCK

This patent application is a Divisional Application and claims the Priority Date of a co-pending application Ser. No. 13/200,869 filed on Oct. 4, 2011 and application Ser. No. 13/200,869 is a Divisional Application and claims the Priority of application Ser. No. 11/796,985 filed on Apr. 30, 2007 by common Inventors of this Application now issued into U.S. Pat. No. 8,035,159. The Disclosures made in the patent application Ser. Nos. 13/200,869 and 11/796,985 are hereby incorporated by reference.

BACKGROUND OF THE INVENTION

1. Field of the Invention

The invention relates generally to the semiconductor power devices. More particularly, this invention relates to an improved and novel manufacturing process and device configuration for providing the MOSFET device with trench gates having thick bottom trench oxide or split gate by applying high density plasma based manufacturing processes with reduced number of masks.

2. Description of the Related Art

In order to reduce the power consumptions and to increase the switching speed of a power semiconductor power device, it is desirable to further reduce the gate capacitance. Generally, in a trench gate MOSFET device, a reduced gate capacitance is achieved by forming a thick oxide layer on the trench bottom of the trench gate. Alternately, the trench gate is formed as a split gate to reduce the gate capacitance. However, in order to form a thick oxide layer on the trench bottom or a split gate with split and mutually insulated bottom and top gate segment in the trench typically require additional processing steps. These additional processing steps may adversely affect the device production yields and costs and further reduce the device reliability due to the potential errors that may be introduced in carrying out the more complicate manufacturing processes.

Therefore, a need still exists in the art of power semiconductor device design and manufacture to provide new manufacturing method and device configuration in forming the power devices such that the above discussed problems and limitations can be resolved. It is desirable to simplify the manufacturing processes in forming the thick oxide layer on the bottom of the trench gate. Alternately, it is further desirable to simplify the processes in forming the split gate in the trench of a semiconductor power device such that the technical limitations can be resolved.

SUMMARY OF THE PRESENT INVENTION

It is therefore an aspect of the present invention to provide a new and improved semiconductor power device by applying a new manufacturing method that is able to control plasma deposition at target areas. This new HDP deposition method is able to simplify the process by applying the high-density plasma (HDP) deposition of thick oxide layer at the trench bottom such that the formation of the thick oxide layer at the trench bottom can be significantly simplified and the above-discussed technical difficulties can be resolved.

Specifically, it is another aspect of this invention to provide a new and improved semiconductor power device by applying a new manufacturing method with a technique to control a high-density plasma deposition (HDP) of insulation layer at predefined targeted areas. This new HDP deposition method is able to simultaneously deposit a thick oxide layer at the trench bottom and also on the mesa area to serve as an implant mask such the masks required for manufacturing a semiconductor power device is reduced.

Another aspect of this invention is to provide a new and improved semiconductor power device by applying a new manufacturing method with a technique to control a high-density plasma deposition (HDP) of insulation layer at predefined targeted areas. This new HDP deposition method is able to simultaneously deposit a thick oxide layer on top of a bottom gate-segment of a split gate and also on the mesa area to serve as an implant mask such the masks required for manufacturing a semiconductor power device with a split gate is reduced.

Briefly in a preferred embodiment this invention discloses a trenched semiconductor power device. The trenched semiconductor power device includes a trenched gate, opened from a top surface of a semiconductor substrate, surrounded by a source region encompassed in a body region near the top surface above a drain region disposed on a bottom surface of a substrate. The semiconductor power device further includes an implanting-ion block disposed above the top surface on a mesa area next to the body region for blocking body implanting ions and source ions from entering into the substrate under the mesa area whereby masks for manufacturing the semiconductor power device can be reduced.

In an exemplary embodiment, the implanting-ion block further includes an oxide layer having a thickness larger than 0.3 micron, preferably between 0.5 and 1.5 micron.

In another exemplary embodiment, the implanting-ion block further includes a chemical vapor deposited (CVD) oxide layer. The CVD oxide can be deposited using LPCVD, or PECVD equipment, using Silane and Oxygen gases, at reduced pressure. Atmospheric pressure APCVD techniques can also be used to deposit the oxide.

In another exemplary embodiment, the implanting-ion block further includes a thermal oxide layer. The thermal oxidation can be done at temperatures in the 900 C. to 1150 C. range, using oxygen, or oxygen with hydrogen, and at atmospheric or enhanced pressures.

In another exemplary embodiment, the implanting-ion block further includes a high-density plasma (HDP) oxide layer HDP oxide is typically used as a trench-fill oxide for STI (Shallow Trench Isolation), or gap-fill dielectric when planarizing multiple layers of metallization, of deep sub-micron technologies.

In another exemplary embodiment, the trenched power semiconductor power device further includes a high-density plasma (HDP) deposited thick oxide layer disposed on a bottom surface of the trenched gate having a thickness greater than that of a gate oxide layer which is on the sidewalls of the trenched gate. And, the implanting-ion block further includes a high-density plasma (HDP) oxide layer having a thickness larger than 0.3 micron, preferably between 0.5 and 1.5 micron formed simultaneously with the HDP deposited thick oxide layer disposed on the bottom surface of the trenched gate. This is possible since the HDP process itself results in oxide layers, which are thicker on flat horizontal surfaces, than on vertical sidewall regions or surfaces.

In another exemplary embodiment, the body region is separated as two-separated body regions disposed on two opposite sides of the trenched gate.

In another exemplary embodiment, the body region constituting a merged body region merged from two separated body regions disposed on two opposite sides of the trenched gate having a inverted V pinnacle point near a bottom center of the body region.

In another exemplary embodiment, the semiconductor power device further includes an insulation protective layer disposed on top of the semiconductor power device having a plurality of contact openings opened therethrough and extending to the body region and the semiconductor power device further including a source/body ohmic contact dopant region disposed beneath each of the contact openings for enhancing ohmic contact to the body/source region.

In another exemplary embodiment, the body region constituting a merged body region merged from two separated body regions disposed on two opposite sides of the trenched gate having a inverted V pinnacle point near a bottom center of the body region wherein the semiconductor power device having a configuration for providing a lowest breakdown voltage near the inverted V pinnacle point for inducing a breakdown near a middle of trenches.

In another exemplary embodiment, the semiconductor power device further includes a metal oxide semiconductor field effect transistor (MOSFET) device.

In another exemplary embodiment, the semiconductor power device further includes a N-channel metal oxide semiconductor field effect transistor (MOSFET) device.

In another exemplary embodiment, the semiconductor power device further includes a P-channel metal oxide semiconductor field effect transistor (MOSFET) device.

In another exemplary embodiment, the semiconductor power device further includes a termination area wherein the implanting-ion block having a greater width than the implanting-ion block on the mesa area for separating the body regions and forming floating body regions in the termination area to form at least a guard ring in a trenched gate surrounded by the floating body region in the termination area.

In another exemplary embodiment, the semiconductor power device further includes an integrated Schottky diode with a field effect transistor (FET) including a body dopant region, with a higher dopant concentration than the body region, disposed adjacent to the source region, and the body dopant region having a region boundary substantially aligned with the ion-implanting block.

In another exemplary embodiment, the trenched gate further includes a split gate (shielded Gate) including a lower gate segment covered by an insulation layer and an upper gate segment above the insulation layer.

In another exemplary embodiment, the trenched gate further includes a split gate (shielded Gate) including a lower gate segment covered by an insulation layer and an upper gate segment above the insulation layer. And, the trenched gate further including a thick oxide layer disposed on a bottom surface of the trenched gate having a thickness greater than a gate oxide layer padding sidewalls of the trenched gate.

In another exemplary embodiment, the semiconductor power device further includes a thick oxide layer disposed on the bottom of the trenched gate as a high-density plasma (HDP) deposited thick oxide layer and the implanting-ion block further includes a HDP deposited oxide layer formed simultaneously with the thick oxide layer disposed on the bottom of the trenched gate.

This invention further discloses a method for manufacturing a trenched semiconductor power device. The method includes a step of opening a plurality of trenches from a top surface of a semiconductor substrate and forming a gate insulation layer on sidewalls and bottom surface of the trenches. The method further includes another step of forming an implanting-ion block above the top surface in a mesa area at a distance away from the trenches for blocking body implanting ions and source ions from entering into the substrate under the mesa area whereby masks for manufacturing the semiconductor power device can be reduced.

In one exemplary embodiment, the step of forming the implanting-ion block further includes a step of forming an oxide layer in the mesa area having a thickness larger than 0.3 micron, preferably between 0.5 and 1.5 micron.

In another exemplary embodiment, the step of forming the implanting-ion block further includes a step of applying a chemical vapor deposition (CVD) to form an oxide layer in the mesa area. The CVD oxide can be deposited using LPCVD, or PECVD equipment, using Silane and Oxygen gases, at reduced pressure. Atmospheric pressure APCVD techniques can also be used to deposit the oxide In another exemplary embodiment, the step of forming the implanting-ion block further includes a step of applying a thermal oxidation to form an oxide layer in the mesa area The thermal oxidation can be done at temperatures in the 900 C. to 1150 C. range, using oxygen, or oxygen with hydrogen, and at atmospheric or enhanced pressures.

In another exemplary embodiment, the step of forming the implanting-ion block further includes a step of applying a high-density plasma (HDP) deposition process to deposit an oxide layer in the mesa area HDP oxide is typically used as a trench-fill oxide for STI (Shallow Trench Isolation), or gap-fill dielectric when planarizing multiple layers of metallization, of deep sub-micron technologies.

In another exemplary embodiment, the method further includes a step of applying a high-density plasma (HDP) deposition process for depositing a thick oxide layer on a bottom surface of the trenched gate having a thickness greater than a gate oxide layer padding sidewalls of the trenched gate. And, the method further includes another step of forming the implanting-ion block simultaneously, by using the HDP deposition process for depositing a thick oxide layer on the bottom surface of the trench, to form a HDP oxide layer as the implanting-ion block in the mesa area having a thickness larger than 0.3 micron, preferably between 0.5 and 1.5 micron. This is possible since the HDP process itself results in oxide layers, which are thicker on flat horizontal surfaces, than on vertical sidewall regions or surfaces.

In another exemplary embodiment, the method further includes a step of implanting body ions into the semiconductor substrate with the implanting-ion block blocking the mesa area and diffusing the body ions into a body region with the body region separated as two separated body regions disposed on two opposite sides of the trenches.

In another exemplary embodiment, the method further includes a step of implanting body ions into the semiconductor substrate with the implanting-ion block blocking the mesa area and diffusing the body ions into a merged body region with the body region merged from two separated body regions disposed on two opposite sides of the trenched gate having a inverted V pinnacle point near a bottom center of the body region.

In another exemplary embodiment, the method further includes a step of forming an insulation protective layer on top of the semiconductor power device and opening a plurality of contact openings therethrough and extending to a body region. And the method further includes another step of implanting a source-body ohmic contact dopant to form a source/body ohmic contact dopant region beneath each of the contact openings for enhancing ohmic contact to the body/source region.

In another exemplary embodiment, the method further includes a step of implanting body ions into the semiconductor substrate with the implanting-ion block blocking the mesa area and diffusing the body ions into a merged body region with the body region merged from two separated body regions disposed on two opposite sides of the trenched gate having a inverted V pinnacle point near a bottom center of the body region. And the method further includes another step of configuring the semiconductor power device to have a lowest breakdown voltage near the inverted V pinnacle point for inducing a breakdown near a bottom of the body region.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 4A to 4E are a series of cross sectional views for describing the manufacturing processes by applying a new HDP process to form a trenched MOSFET device of this invention with split gate and thick oxide layer on the trench bottom by using reduced number masks.

FIGS. 5A to 5E are a series of cross sectional views for describing the manufacturing processes by applying a new HDP process to form a trenched MOSFET device of this invention with split gate by using reduced number masks.

DETAILED DESCRIPTION OF THE METHOD

Figure 1A:
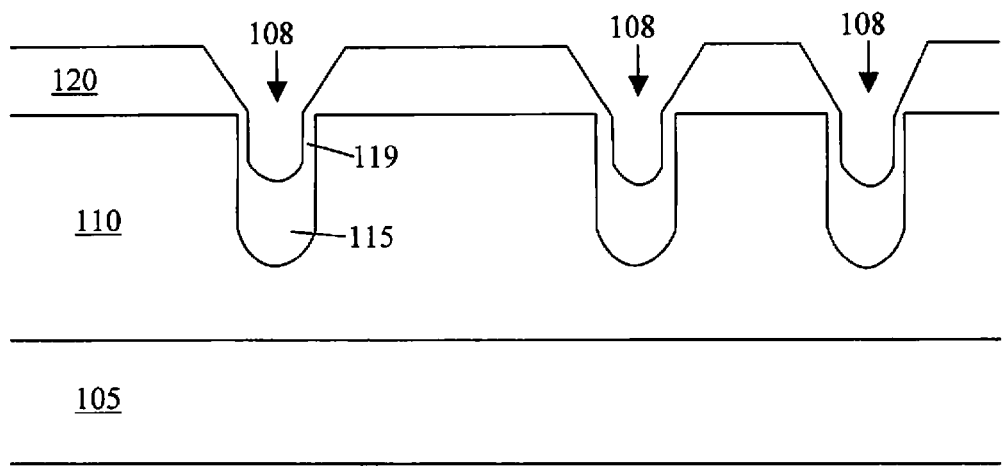
FIGS. 1A to 1G are cross sectional views for describing the manufacturing processes in applying a new HDP process to form the trenched MOSFET devices of this invention with reduced number of masks.
Figure 1B:
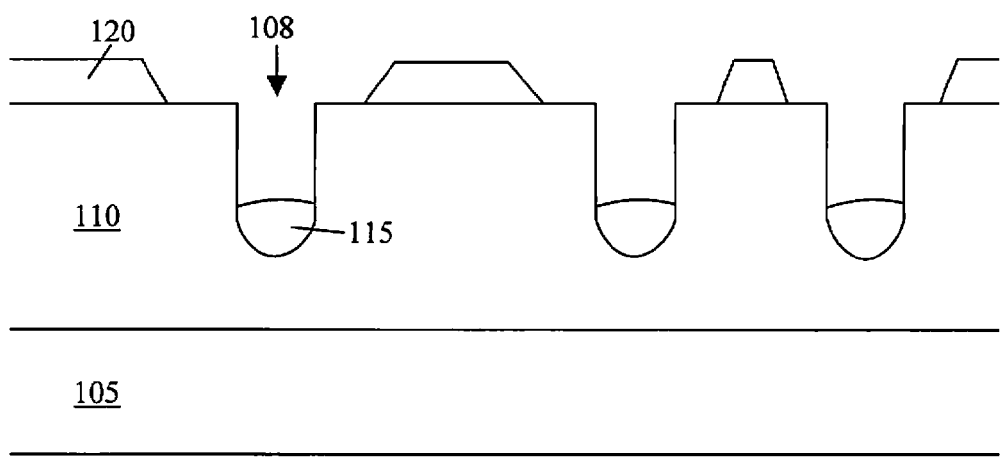
Figure 1C:
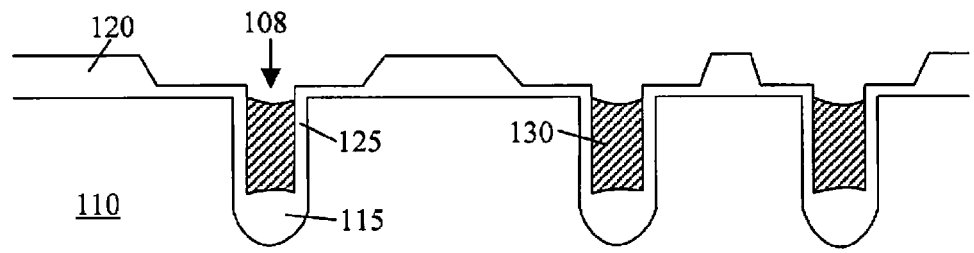

Referring to FIGS. 1A to 1G for a series of cross sectional views for describing the manufacturing processes of a new and improved trench MOSFET device of this invention. In FIG. 1A, a first mask (not shown) is first applied to open a plurality of trenches 108 into an epitaxial layer 110 supported on a semiconductor substrate 105. Then a high-density plasma (HDP) oxide layer is applied to form a thick oxide layer 115 at the trench bottom and thinner oxide layer 119 on trench sidewalls and thicker oxide layer 120 on the top surface of the substrate. In FIG. 1B, an oxide wet etch is carried out to etch out the thinner oxide layer 119 surrounding the sidewalls of the trench 108 and also a part of the thick oxide layer 120 near the trenches 108 and leaving only the thick oxide layer 120 in the mesa area and the thicker oxide layer 115 on the trench bottom. In FIG. 1C, a gate oxide layer 125 is then formed by thermal oxidation followed with filling the trenches 108 with polysilicon and etch back to form the polysilicon gate 130 in the trenches. Alternatively gate oxide 125 may be formed by deposition, preferably using HTO (high temperature oxide) techniques by mixing dicholorosilane with oxygen, at reduced pressure, in the range of 700-900 C., resulting a conformal oxide deposition layer over the trench sidewall, as well as the remaining HDP oxide. Gate oxide thickness can be in the 100A to 1500A range, or more, depending on the desired gate-source voltage rating for the transistor.

Figure 1D:
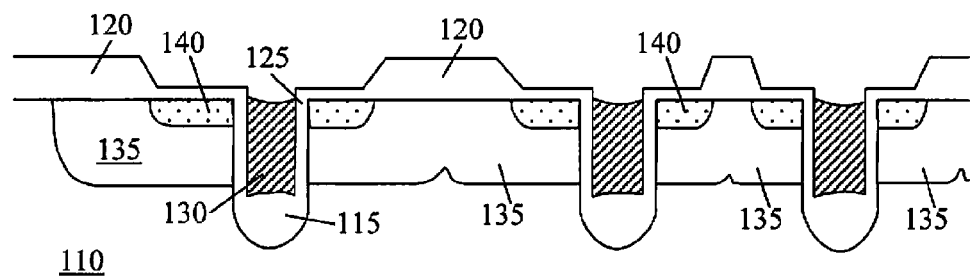

In FIG. 1D, a body implant is performed followed by a diffusion operation to drive the body region 135 into the epitaxial layer 110. Alternatively, the body implant may be carried out with angled and rotated implant before gate oxide layer 125 is formed, using oxide region 120 on top of the mesa and oxide region 115 on the trench bottom as a mask. One advantage of this later approach is the body does not need to drive as far as the previous approach, therefore the lateral diffusion is less and the body region can be narrower, thus the cells can be packed tighter. Then a source implant is performed followed by a source region drive operation to form the source regions 140. As shown in FIG. 1D, with the thicker oxide layer 120 disposed in the mesa areas, the body and source implant operations are carried out without requiring implant masks thus achieve manufacturing process simplification and cost savings.

In one embodiment, the thick oxide 120 blocks the body implant that the two body regions under each side of oxide 120 are completely separated after diffusion (not shown); in another embodiment, the two body regions merge together after diffusion forming an inverted V shape profile in the merging area in the middle of the two trenches, as shown in FIG. 1D. The vertical position of the inverted V pinnacle point can be carefully controlled by adjusting the mesa width, the implant energy and diffusion depth.

Figure 1E:
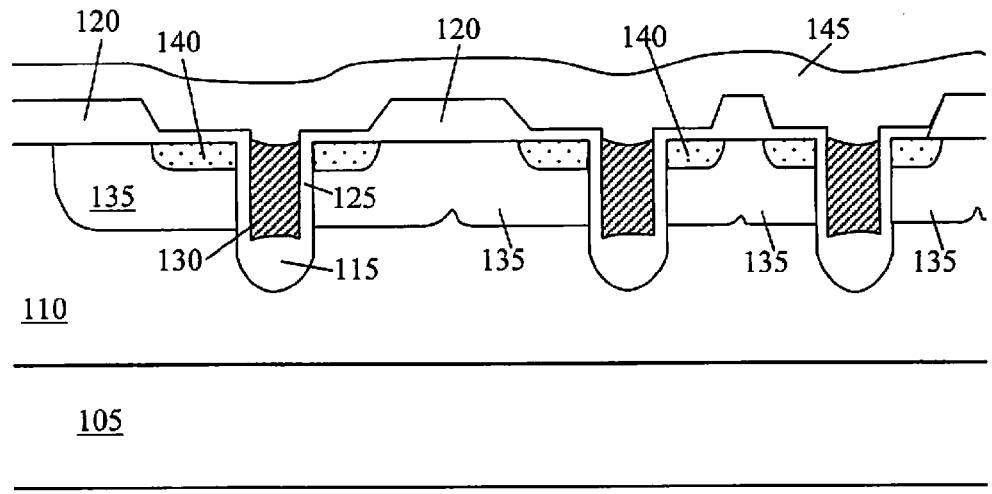
Figure 1F:
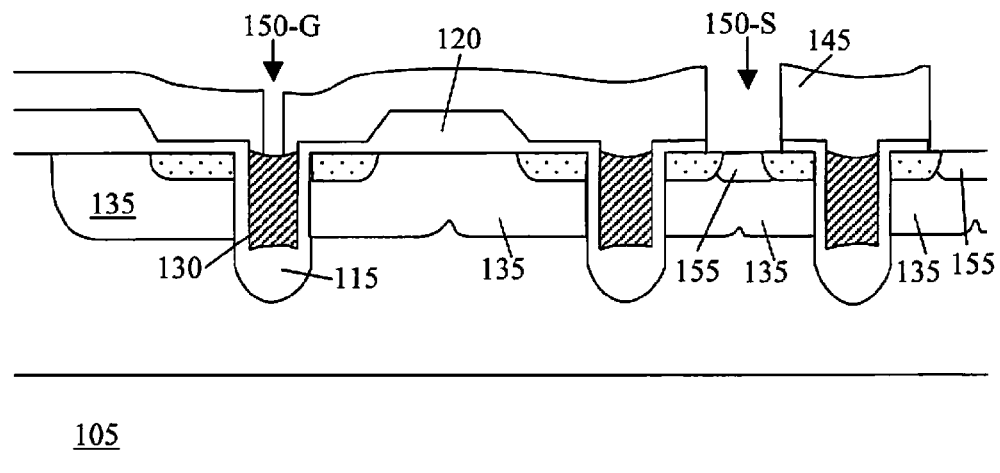
Figure 1G:
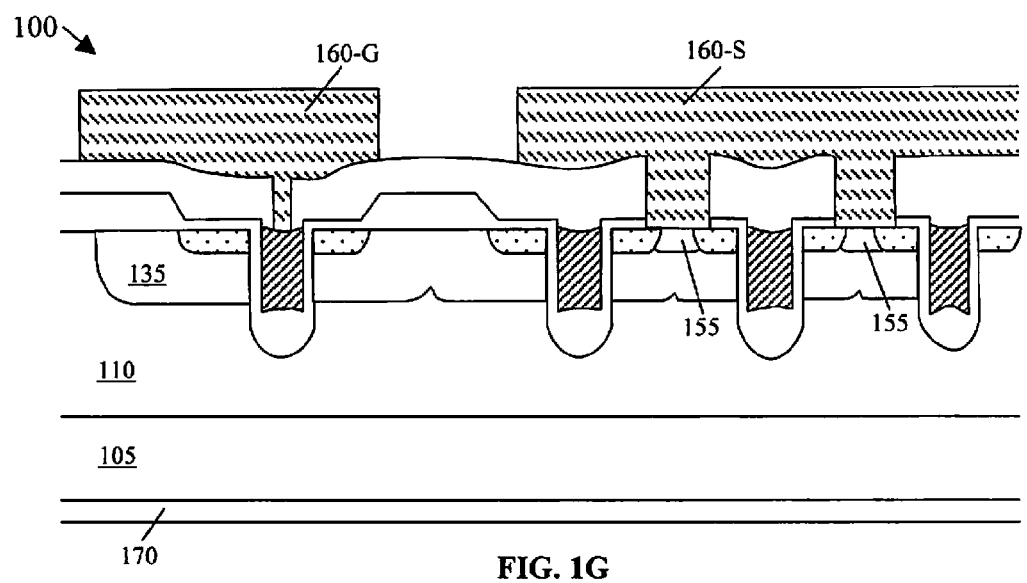

In FIG. 1E, insulation layer 145, e.g., LTO oxide layer and BPSG layer, is deposited on the top surface. In FIG. 1F, a third mask (not shown) is applied to open a plurality of source and gate contact openings 150-S and 150-G respectively. A P+ contact region 155 is implanted then activated at elevated temperature to form source/body metal ohmic contact and gate metal ohmic contact through the layer 145. In FIG. 1G, the manufacturing processes are then completed with metal layer deposition and patterning on the top surface to form the source metal 160-S and gate pad 160-G and backside metal contact formation for drain connection 170 to the MOSFET 100 device.

A new and improved manufacturing process is disclosed with the MOSFET 100 shown above that has thicker oxide layer at the bottom of the trench gate and is manufactured with only three masks. The MOSFET device further has a new structure wherein the thick oxide layer 115 at the bottom of the trench gate is formed by HDP oxide as the HDP oxide layer 120 in the mesa area. By controlling the mesa width, the body depth and the P+ contact implant regions 155, a high electric filed may be created between the bottom of P+ contact implant 155 and the inverted V pinnacle point so that the breakdown at this region will occur before other area reach breakdown voltage.

Figure 2:
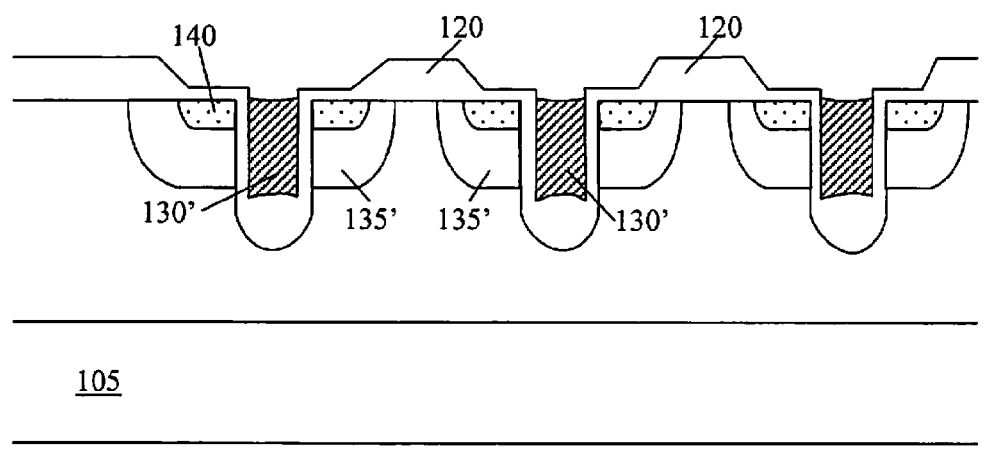
FIG. 2 is a cross sectional view of a MOSFET device for illustrating the configuration of the guard rings in the termination area for a MOSFET device of shown in FIG. 1.

Referring to FIG. 2 for a cross sectional view of a MOSFET device for illustrating the configuration of the guard rings in the termination area for a MOSFET device 100 shown in FIG. 1. For the purpose of forming the guard rings to sustain higher voltages, the spacing between the trenches 130' in the termination area is increased to have a wider space between the trench gates 130' and consequently the body regions 135' are formed as separated floating regions as shown to provide the guarding ring protection functions. If necessary, a separate mask may be applied to block the n+ implant into the guard ring areas and that would increase the number of masks to four as required for manufacturing the MOSFET device with guard rings that are different from FIG. 2 without the n+ regions 140.

Figure 3A:
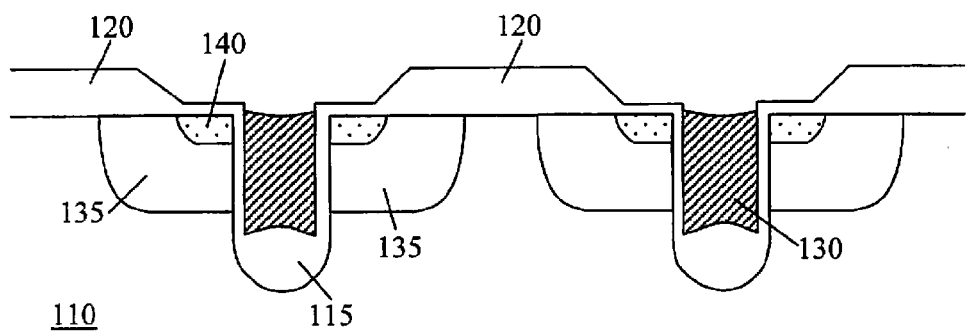
FIGS. 3A to 3C are cross sectional views for describing the manufacturing processes by applying a new HDP process to form a trenched MOSFET device of this invention with thick oxide with embedded Schottky FET with reduced number masks.
Figure 3B:
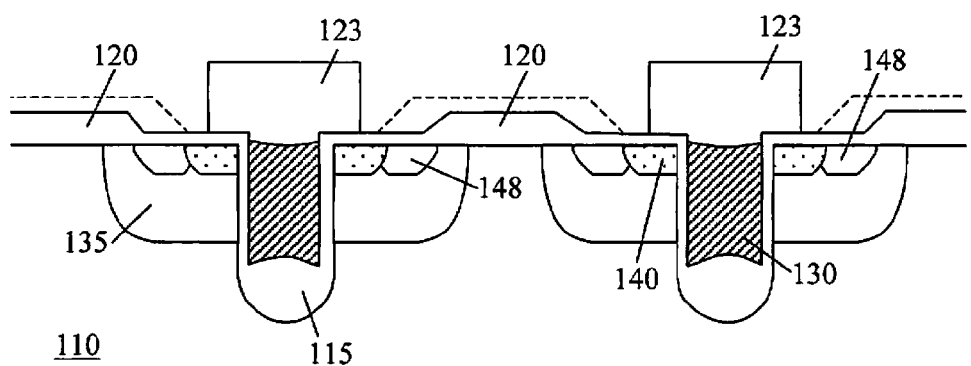
Figure 3C:
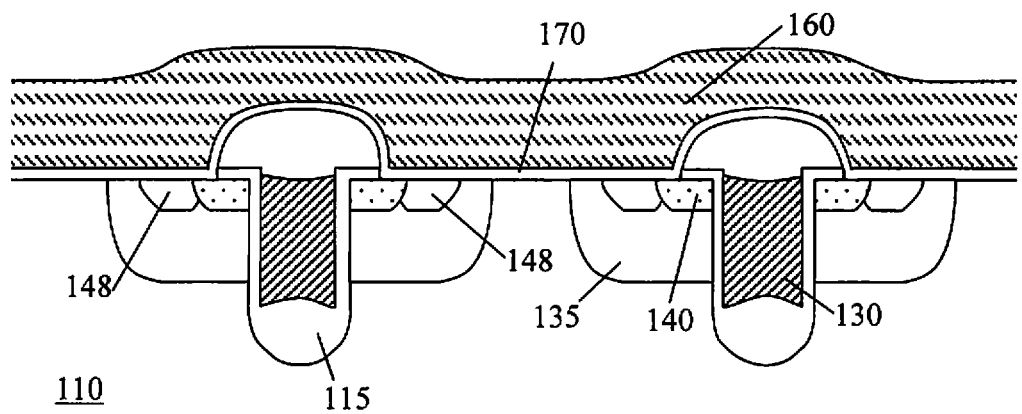

Referring to FIGS. 3A to 3C for a series of cross sectional views for describing the manufacturing processes by applying a new HDP process to form a trenched MOSFET device of this invention with thick oxide at bottom of trench gate and with embedded Schottky diode. The new method enables the manufacture of such device with reduced number masks. Referring to FIGS. 1A to 1D for the processing steps by applying a first mask to complete the manufacturing processes for a partially completed device as shown in FIG. 3A. The only exception is that the body regions 135 in FIG. 3A are formed as separated body regions instead of merging together as that shown in FIG. 1D. In FIG. 3B, a second mask 123 is applied as a contact block mask to pull back the HDP surface oxide layer 120 followed by a P+ contact implant to form the contact implant regions 148.

The manufacturing processes proceed by first removing the contact block mask 123 and the deposition of insulation layers of LTO/BPSG then applying a third mask as a contact mask to open the metal contact openings through the insulation layers. After BPSG reflow a Schottky barrier 170 followed by a metal layer 160 is deposited and patterned as source pad and gate pad as that shown and described in FIGS. 1E to 1G above. The final structure as shown in FIG. 3C is therefore completed with four masks that has a MPS (Merged PIN/Schottky) or JBS (junction barrier shcottky) rectifier within each cell. Specifically, the Schottky barrier layer 170, the P body regions 135 and the N-epi region between the separated P body regions configuring a MPS/JBS that greatly reduces the voltage drop over the MOSFET body diode in reverse conducting mode.

Figure 4A:
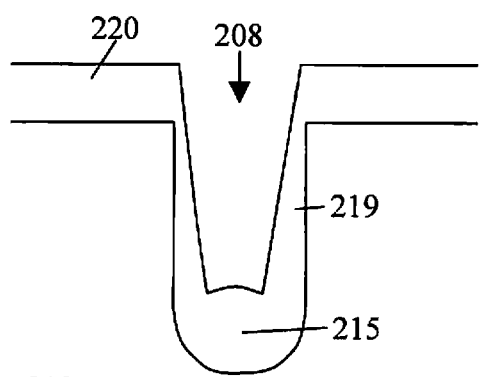
Figure 4B:
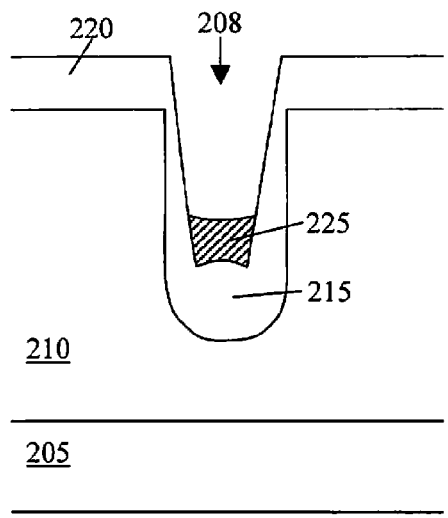
Figure 4C:
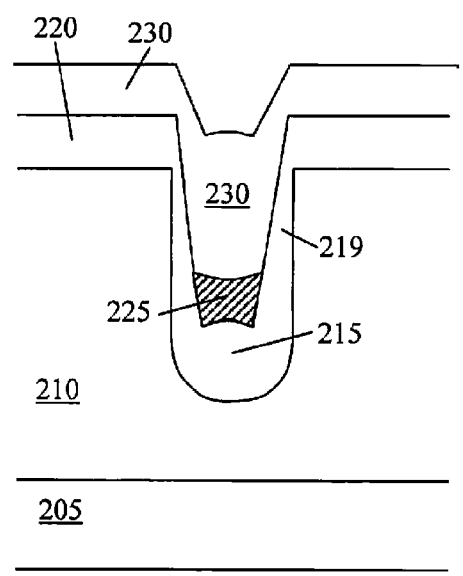

Referring to FIGS. 4A to 4E for a series of cross sectional views for describing the manufacturing processes by applying a new HDP process to form a trenched MOSFET device of this invention with split gate and thick oxide layer on the trench bottom by using reduced number masks. In FIG. 4A, a first mask (not shown) is first applied to open a plurality of trenches 208 into an epitaxial layer 210 supported on a semiconductor substrate 205. Then a high-density plasma deposition (HDP) of oxide layer is applied to form a thick oxide layer 215 at the trench bottom and thinner oxide layer 219 and thicker oxide layer 220 on the top surface of the substrate. In FIG. 4B, a deposition of first polysilicon gate and etch back of the polysilicon is carried out to form the bottom segment of the gate 225 at the bottom portion of the trenches 208. In FIG. 4C, a second high-density plasma deposition (HDP) oxide layer is carried out to deposit a second oxide layer 230 on top of the first HDP oxide layer 215 and the first gate segment 225. In FIG. 4D, an oxide etch is carried out to etch out part of the oxide layers 230 and the upper portion of thinner oxide 219 surrounding the sidewalls of the trench 208. The oxide etch also removes the second HDP layer 230 and a part of the thick oxide layer 220 near the trenches 208 and leaving only thick oxide layer 220 in the mesa area and the thick second HDP oxide layer 230 on top of the bottom gate segment. In FIG. 4E, the split gate is formed by a depositing a second polysilicon layer 240 followed by a polysilicon etch back to form the upper gate segment 240 on top of the inter-poly insulation layer 230 formed by the second HDP oxide deposition process. After the formation of the split gate, the MOSFET manufacturing processes proceed according to the steps as that described in FIGS. 1D to 1G.

Figure 5A:
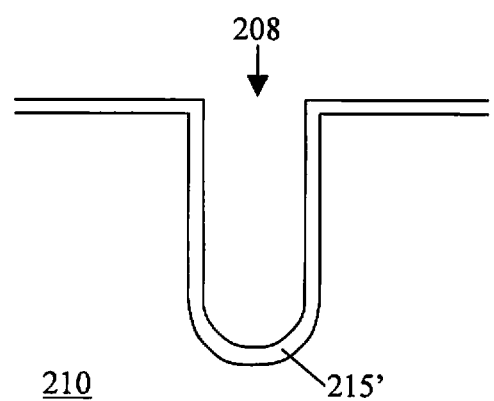
Figure 5B:
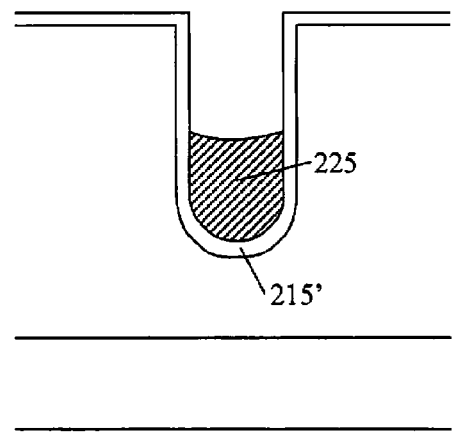
Figure 5C:
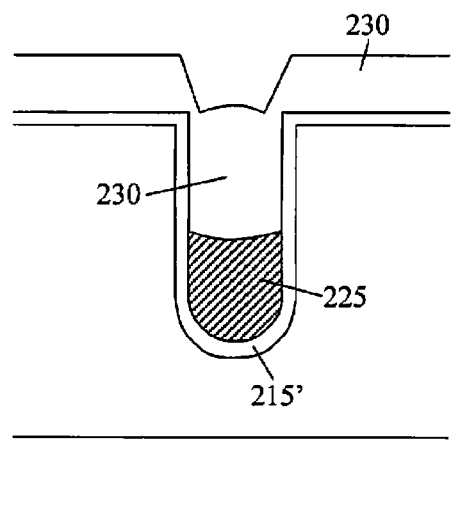

Referring to FIGS. 5A to 5E for a series of cross sectional views for describing the manufacturing processes by applying a new HDP process to form a trenched MOSFET device of this invention with split gate by using reduced number masks. The manufacturing processes are similar to that described for FIGS. 4A to 4E. The only differences are shown in FIGS. 5A and 5B where normal thermal oxide layer 215' with uniform thickness is formed on the trench bottom without applying a HDP oxide deposition to form the thick trench bottom oxide 215 as shown in FIGS. 4A and 4B. The remainder of the processing steps as shown in FIGS. 5C to 5E are basically identical to that shown in FIGS. 4C to 4E with the exception that the thick oxide layer 230 in the mesa area is formed by the only HDP oxide deposition since unlike the processes shown in FIGS. 4A to 4E, there is only one HDP oxide deposition process. Therefore, the MOSFET device with split gates can be manufactured with reduced number of masks by taking advantage of the HDP oxide deposition process that is provide to form oxide layer with different thickness in different targeted areas.

Figure 6A:
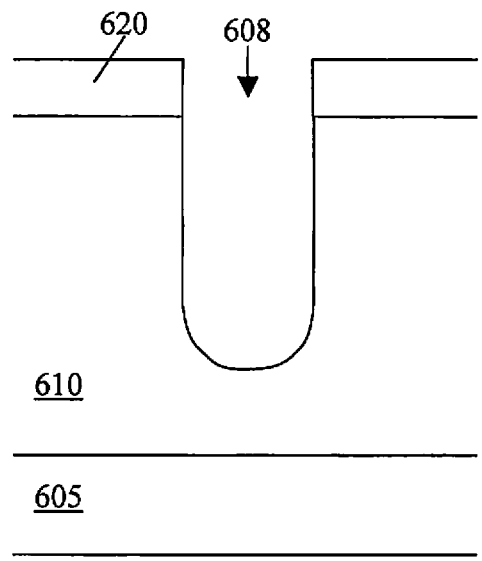
FIGS. 6A to 6C are a series of cross sectional views for describing the manufacturing processes by applying a new process to form a trenched MOSFET device of this invention with reduced number of masks by using an implanting-ion blocks on the mesa areas in the MOSFET device.
Figure 6B:
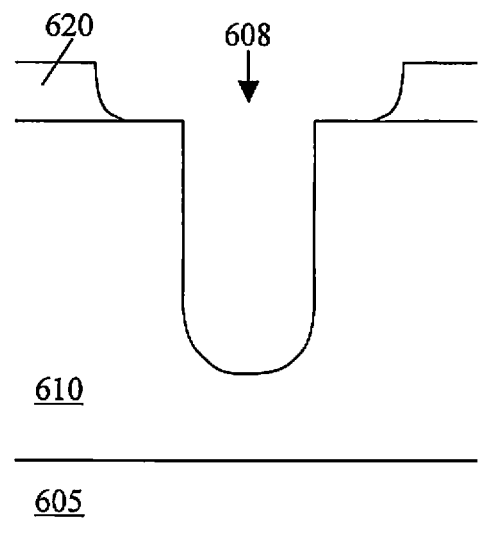
Figure 6C:
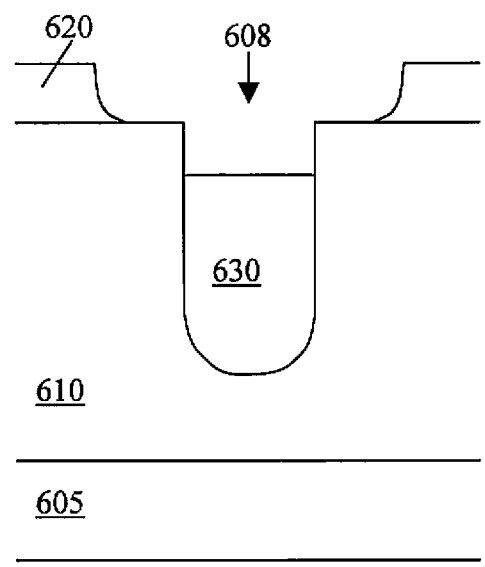

The goal to reduce the mask count in MOSFET manufacturing process can also be achieved using regular thermal oxidation process or CVD deposition. FIGS. 6A-6C describe such a process. In FIG. 6A a thick oxide layer 620 is grown through thermal oxidation or CVD deposition and is used as a hard mask by applying trench mask to etch trench 608 into the epi layer 610 overlaying substrate 605. In FIG. 6B, an oxide pull back etch is carried out to remove the oxide near the trench forming a source/body implant block. A gate is then formed within the trench following the standard process to form a split gate or a normal gate before the body and source are implanted. Alternatively, the body and source implant may be carried out before the gate formation using a resist 630 to fill the trench to block source body implanting into the bottom of trench as shown in FIG. 6C. The device is then completed with the normal manufacturing process.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method for manufacturing a trenched semiconductor power device comprising:

applying a trench mask for opening a plurality of trenches from a top surface of a semiconductor substrate by configuring the trench mask having a greater distance between two adjacent trenches in a termination area than an active cell area and forming a thick insulation layer covering over trench sidewalls and a bottom surface of said trenches and also simultaneously covering over the top surface of the semiconductor substrate outside of the trenches;

applying an implanting-ion block mask for etching the thick insulation layer from a top part of the trenches and the trench sidewalls and also simultaneously from an area surrounding the trenches thus leaving a thick bottom insulation layer at a bottom portion of the trenches and implanting-ion blocks above said top surface in a mesa area between and at a distance away from said trenches and in a middle portion between two of said trenches for blocking body implanting ions and source ions from entering into said substrate under said mesa area whereby masks for manufacturing said semiconductor power device can be reduced; and implanting body dopant ions and source dopant ions with said implanting-ion block blocking said mesa area in the middle portion between two of said trenches to form body regions encompassing source regions and forming the body regions in the termination area as floating body regions to function as guard rings for the semiconductor power device.

2. The method of claim 1 wherein:
the step of forming the thick insulation layer further comprising a step of forming an oxide layer having a thickness larger than 0.3 microns.

3. The method of claim 1 wherein:
the step of forming the thick insulation layer further comprising a step of applying a HDP deposition process to form an HDP oxide layer covering over trench sidewalls and the bottom surface of said trenches and also covering over the top surface of the semiconductor substrate outside of the trenches.

4. The method of claim 1 wherein:
the step of forming the thick insulation layer further comprising a step of applying a high-density plasma (HDP) deposition process for depositing a thick oxide layer covering a bottom surface of said trenches and also covering over the top surface of the semiconductor substrate outside of the trenches having a thickness larger than 0.3 microns and greater than a thickness of the insulation layer covering the trench sidewalls having a thickness larger than 0.3 microns and greater than a thickness of the insulation layer covering the trench sidewalls.

5. The method of claim 1 wherein:
the step of forming the thick insulation layer further comprising a step of applying a chemical vapor deposition (CVD) to form an oxide layer covering over trench sidewalls and the bottom surface of said trenches and also covering over the top surface of the semiconductor substrate outside of the trenches.

6. The method of claim 1 wherein:
the step of forming said thick insulation layer further comprising a step of applying a thermal oxidation to form an oxide layer covering over trench sidewalls and the bottom surface of said trenches and also covering over the top surface of the semiconductor substrate outside of the trenches.

7. A method for manufacturing a trenched semiconductor power device comprising:
applying a trench mask for opening a plurality of trenches from a top surface of a semiconductor substrate by configuring the trench mask having a greater distance between two adjacent trenches in a termination area than an active cell area and forming a thick insulation layer covering over trench sidewalls and a bottom surface of said trenches and also simultaneously covering over the top surface of the semiconductor substrate outside of the trenches;
applying an implanting-ion block mask for etching the thick insulation layer from a top part of the trenches and the trench sidewalls and also simultaneously from an area surrounding the trenches thus leaving a thick bottom insulation layer at a bottom portion of the trenches and implanting-ion blocks above said top surface in a mesa area between and at a distance away from said trenches and in a middle portion between two of said trenches for blocking body implanting ions and source ions from entering into said substrate under said mesa area whereby masks for manufacturing said semiconductor power device can be reduced; and
implanting body dopant ions with said implanting-ion block and followed by applying a source ion implant mask for implanting source dopant ions to form body regions encompassing source regions adjacent to the mesa area in the middle portion between two of said trenches and forming the body regions in the termination area as floating body regions and having no source regions therein to function as guard rings for the semiconductor power device.

8. The method of claim 7 wherein:
the step of forming the thick insulation layer further comprising a step of forming an oxide layer having a thickness larger than 0.3 microns.

9. The method of claim 7 wherein:
the step of forming the thick insulation layer further comprising a step of applying a HDP deposition process to form an HDP oxide layer covering over trench sidewalls and the bottom surface of said trenches and also covering over the top surface of the semiconductor substrate outside of the trenches.

10. The method of claim 7 wherein:
the step of forming the thick insulation layer further comprising a step of applying a high-density plasma (HDP) deposition process for depositing a thick oxide layer covering bottom surface of said trenches and also covering over the top surface of the semiconductor substrate outside of the trenches having a thickness larger than 0.3 microns and greater than a thickness of the insulation layer covering the trench sidewalls having a thickness larger than 0.3 microns and greater than a thickness of the insulation layer covering the trench sidewalls.

11. The method of claim 7 wherein:
the step of forming the thick insulation layer further comprising a step of applying a chemical vapor deposition (CVD) to form an oxide layer covering over trench sidewalls and the bottom surface of said trenches and also covering over the top surface of the semiconductor substrate outside of the trenches.

12. The method of claim 7 wherein:
the step of forming said thick insulation layer further comprising a step of applying a thermal oxidation to form an oxide layer covering over trench sidewalls and the bottom surface of said trenches and also covering over the top surface of the semiconductor substrate outside of the trenches.

13. A method for manufacturing a trenched semiconductor power device comprising:
applying a trench mask for opening a plurality of trenches from a top surface of a semiconductor substrate by configuring the trench mask having a greater distance between two adjacent trenches in a termination area than an active cell area and forming a thick insulation layer covering over trench sidewalls and a bottom surface of said trenches and also simultaneously covering over the top surface of the semiconductor substrate outside of the trenches;
applying an implanting-ion block mask for etching the thick insulation layer from a top part of the trenches and the trench sidewalls and also simultaneously from an area surrounding the trenches thus leaving a thick bottom insulation layer at a bottom portion of the trenches and implanting-ion blocks above said top surface in a mesa area between and at a distance away from said trenches and in a middle portion between two of said trenches for blocking body implanting ions and source ions from entering into said substrate under said mesa area whereby masks for manufacturing said semiconductor power device can be reduced; and implanting P-type body dopant ions with said implanting-ion block and followed by applying a source ion implant mask for implanting N-type source dopant ions to form P-type body regions encompassing N-type source regions adjacent to the mesa area with said implanting-ion block and forming the P-type body regions in the termination area as floating body regions and having no source regions therein to function as guard rings for the semiconductor power device.

14. The method of claim 13 wherein:
the step of forming the thick insulation layer further comprising a step of forming an oxide layer having a thickness larger than 0.3 microns.

15. The method of claim 13 wherein:
the step of forming the thick insulation layer further comprising a step of applying a HDP deposition process to form an HDP oxide layer covering over trench sidewalls and the bottom surface of said trenches and also covering over the top surface of the semiconductor substrate outside of the trenches.

16. The method of claim 13 wherein:
the step of forming the thick insulation layer further comprising a step of applying a high-density plasma (HDP) deposition process for depositing a thick oxide layer covering bottom surface of said trenches and also covering over the top surface of the semiconductor substrate outside of the trenches having a thickness larger than 0.3 microns and greater than a thickness of the insulation layer covering the trench sidewalls having a thickness larger than 0.3 microns and greater than a thickness of the insulation layer covering the trench sidewalls.

17. The method of claim 13 wherein:
the step of forming the thick insulation layer further comprising a step of applying a chemical vapor deposition (CVD) to form an oxide layer covering over trench sidewalls and the bottom surface of said trenches and also covering over the top surface of the semiconductor substrate outside of the trenches.

18. The method of claim 13 wherein:
the step of forming said thick insulation layer further comprising a step of applying a thermal oxidation to form an oxide layer covering over trench sidewalls and the bottom surface of said trenches and also covering over the top surface of the semiconductor substrate outside of the trenches.

\* \* \* \* \*